US009331283B2

(12) United States Patent
Lim et al.

(10) Patent No.: US 9,331,283 B2
(45) Date of Patent: May 3, 2016

(54) NANOPARTICLES, METHOD OF MANUFACTURING NANOPARTICLES, AND ELECTRONICS DEVICE INCLUDING THE SAME

(71) Applicant: KOREA INSTITUTE OF SCIENCE AND TECHNOLOGY, Seoul (KR)

(72) Inventors: Jung Ah Lim, Goyang-si (KR); Yong-Won Song, Daejeon (KR); Jae-Min Hong, Seoul (KR); Dong Youn Yoo, Incheon (KR); Hee-Suk Kim, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 158 days.

(21) Appl. No.: 13/947,386

(22) Filed: Jul. 22, 2013

(65) Prior Publication Data

US 2014/0061546 A1   Mar. 6, 2014

(30) Foreign Application Priority Data

Aug. 30, 2012  (KR) .......................  10-2012-0095763

(51) Int. Cl.

| | | |
|---|---|---|
| *C01B 31/00* | (2006.01) | |
| *H01L 51/00* | (2006.01) | |
| *H01B 1/04* | (2006.01) | |
| *C08J 3/215* | (2006.01) | |
| *C08G 61/02* | (2006.01) | |
| *C08K 3/04* | (2006.01) | |
| *H01L 51/42* | (2006.01) | |
| *H01L 51/50* | (2006.01) | |
| *B82Y 30/00* | (2011.01) | |
| *B82Y 40/00* | (2011.01) | |

(52) U.S. Cl.
CPC ............ *H01L 51/0038* (2013.01); *C08G 61/02* (2013.01); *C08J 3/215* (2013.01); *C08K 3/04* (2013.01); *H01B 1/04* (2013.01); *B82Y 30/00* (2013.01); *B82Y 40/00* (2013.01); *C08G 2261/1412* (2013.01); *C08G 2261/1424* (2013.01); *C08G 2261/3142* (2013.01); *C08G 2261/3422* (2013.01); *C08J 2365/00* (2013.01); *H01L 51/0039* (2013.01); *H01L 51/42* (2013.01); *H01L 51/50* (2013.01)

(58) Field of Classification Search
CPC ............ H01L 51/0038; H01L 51/0039; C01B 31/043; C01B 2204/00; C01B 2204/02

USPC ................ 252/500; 428/403, 407; 423/415.1; 427/74, 58

See application file for complete search history.

(56) References Cited

U.S. PATENT DOCUMENTS

| 8,257,867 B2 * | 9/2012 | Liu et al. ..................... 429/231.5 |
| 8,883,351 B2 * | 11/2014 | Todoriki et al. ............. 429/231.8 |
| 2010/0221508 A1 | 9/2010 | Huang et al. |
| 2011/0186789 A1 | 8/2011 | Samulski et al. |
| 2011/0210282 A1 | 9/2011 | Foley |
| 2013/0235509 A1 * | 9/2013 | Ruoff ..................... H01G 11/46 361/502 |
| 2013/0306934 A1 * | 11/2013 | Lee ................................ 257/12 |

FOREIGN PATENT DOCUMENTS

| KR | 10-2011-0115085 | 10/2011 |
| KR | 10-2012-0103154 | 9/2012 |
| KR | 10-2012-0122474 | 11/2012 |
| KR | 10-2013-0000803 | 1/2013 |

OTHER PUBLICATIONS

Q. Ou et al., "Characteristics of graphene-layer encapsulated nanoparticles fabricated using laser ablation method", Diamond & Related Materials, 17 (2008) 664-668.*
English machine translation of Jeong et al., 1020120103154, Sep. 19, 2012.*
Yan Gao et al., "Surface Doping of Conjugated Polymers by Graphene Oxide and Its Application for Organic Electronic Devices", Advanced Materials. 2011, vol. 23, pp. 1903-1908.
Chun Xian Guo et al., "A Hierarchically Nanostructured Composite of $MnO_2$/Conjugated Polymer/Graphene for High-Performance Lithium Ion Batteries", Advanced Energy Materials. 2011, vol. 1, pp. 736-741.
J. Kim et al., "Graphene Oxide Sheets at Interfaces," *J. Am. Chem. Soc.*, May 2010, No. 132, pp. 8180-8186.
F.-F. Zhang, "Facile and effective synthesis of reduced graphene oxide encapsulated sulfur via oil/water system for high performance lithium sulfur cells," *J. Mater. Chem.*, 2012, No. 22, pp. 11452-11454.

* cited by examiner

*Primary Examiner* — Douglas McGinty
(74) *Attorney, Agent, or Firm* — Goldilocks Zone IP Law

(57) ABSTRACT

The method of manufacturing nanoparticles of a target material includes mixing graphene oxide with an aqueous solvent to prepare an aqueous solution, mixing the target material with an organic solvent to prepare an organic solution, mixing the aqueous solution with the organic solution, and preparing nanoparticles of the target material by the graphene oxide.

18 Claims, 20 Drawing Sheets

NANOPARTICLES, METHOD OF MANUFACTURING NANOPARTICLES, AND ELECTRONICS DEVICE INCLUDING THE SAME

CROSS-REFERENCE TO RELATED APPLICATION

This application claims priority to and the benefit of Korean Patent Application No. 10-2012-0095763 filed in the Korean Intellectual Property Office on Aug. 30, 2012, the entire contents of which are incorporated herein by reference.

BACKGROUND OF THE INVENTION (a) Field of the Invention

A method of manufacturing nanoparticles, nanoparticles, and an organic light emitting diode, a solar cell, a printing ink, a bioimaging device, and a sensor including the same.

(b) Description of the Related Art

Recently, nanoparticles of a polymer or a metal oxide or the like have been widely used for an organic light emitting diode, a solar cell, a sensor, or the like. The nanoparticles need to be provided in an aqueous solution, and the conventional nanoparticle aqueous solution may be manufactured by miniemulsification, reprecipitation, or the like.

In the case of miniemulsification, a target material is dissolved in a hydrophobic organic solvent and then added to water including a surfactant. Then the target material forms nanoparticles according to ultrasonication, and the organic solvent is evaporated to provide a nanoparticle aqueous solution stabilized by the surfactant.

The surfactant does not affect the optical properties (UV-vis, PL spectrum) or the like of nanoparticles, but may deteriorate the electrical properties (exciton generation, migration, and recombination) or the like, so that application to the organic light emitting diode is limited.

The precipitation uses the phenomenon that the target material is aggregated in nanoparticles when the target material is dissolved in a polar organic solvent that is miscible with water and added to water. The nanoparticle obtained by precipitation has demerits of deteriorating the optical properties of nanoparticles since the target material is easily aggregated and the difficulty of controlling the nanoparticle size. In addition, the nanoparticle has narrow application fields since it is difficult to induce the functional group to the nanoparticle to apply the various functions.

Therefore, a method of manufacturing nanoparticles which may maintain the electrical characteristics while not deteriorating the optical characteristics of a target material and may apply the various functions to the target material is required.

SUMMARY OF THE INVENTION

This disclosure is to provide nanoparticles safely and uniformly in an aqueous solution and that may induce various functional groups, and a method of manufacturing nanoparticles.

By applying the nanoparticles, an organic light emitting diode, a solar cell, a printing ink, a bioimaging device, and a sensor having excellent optical properties and electrical properties may be provided.

A method of manufacturing nanoparticles of a target material according to one embodiment of the present invention includes mixing graphene oxide with an aqueous solvent to prepare an aqueous solution, mixing the target material with an organic solvent to prepare an organic solution, mixing the aqueous solution with the organic solution, and preparing nanoparticles of the target material by the graphene oxide.

The target material may include an organic material, an inorganic material, a metallic material, or a combination thereof.

Specifically, the target material may include at least one selected from a polymer, a monomolecule, an organic semiconductor, a metal, an alloy, a metal oxide, a mineral, and a combination thereof.

The target material may be a conjugated polymer.

The method of manufacturing nanoparticles may further include removing the organic solvent after preparing the nanoparticles of the target material by graphene oxide.

The nanoparticles may have a structure in which a graphene oxide is formed on the surface of the target material.

Specifically, the nanoparticles may have a structure in which one graphene oxide layer surrounds one target material particle or a structure in which one graphene oxide layer surrounds about 2 to 10 target material particles.

The nanoparticles may have an average particle diameter of about 1 to 1000 nm. The nanoparticles may have an average particle diameter of about 1 to 300 nm.

The graphene oxide may have a longitudinal diameter of about 1 to 1000 nm. The graphene oxide may have a longitudinal diameter of about 1 to 500 nm.

The graphene oxide may be included at about 1 to 10 parts by weight based on 100 parts by weight of the aqueous solution.

The target material may be included at about 0.1 to 10 parts by weight based on 100 parts by weight of the organic solution.

The method of manufacturing nanoparticles may further include reducing the graphene oxide after removing the organic solvent.

The obtained nanoparticles may have a structure in which one graphene layer surrounds one target material particle. Alternatively, one graphene layer may surround about 2 to 10 target material particles.

According to another embodiment of the present invention, nanoparticles including a target material and a graphene or a graphene oxide formed on a surface of the target material are provided.

The target material may be an organic material, an inorganic material, a metallic material, or a combination thereof.

Specifically, the target material may include at least one selected from a polymer, a monomolecule, an organic semiconductor, a metal, an alloy, a metal oxide, a mineral, and a combination thereof.

The target material may be a conjugated polymer.

The nanoparticles may have a structure in which one graphene or graphene oxide layer surrounds one target material particle.

Alternatively, the nanoparticles may have a structure in which one graphene or graphene oxide layer surrounds about 2 to 10 target material particles. In this case, the nanoparticles may have a structure in which about 2 to 10 target materials surrounded by one graphene or graphene oxide layer are connected to each other.

The nanoparticles may have an average particle diameter of about 1 to 1000 nm. the nanoparticles may have an average particle diameter of about 1 to 300 nm.

According to a further embodiment of the present invention, an aqueous solution including the nanoparticles is provided.

One embodiment of the present invention provides an organic light emitting diode including the nanoparticles.

One embodiment of the present invention provides a solar cell including the nanoparticles.

One embodiment of the present invention provides a printing ink including the nanoparticles.

One embodiment of the present invention provides a bioimaging device including the nanoparticles.

One embodiment of the present invention provides a sensor including the nanoparticles.

The nanoparticles obtained from the method of manufacturing nanoparticles according to the present invention or the nanoparticles according to one embodiment of the present invention may be uniform and stable and may be provided in an aqueous solution. The nanoparticles are non-toxic so they are environmentally friendly, and may be provided in an aqueous solution and may be applied to the various fields of printing, bioimaging, or the like.

The nanoparticles may be formed with graphene oxide on the surface, and thereby provide nanoparticles introduced with the various functional groups.

In addition, an organic light emitting diode, a solar cell, a printing ink, a bioimaging device, and a sensor having excellent optical properties and electrical properties may be provided.

BRIEF DESCRIPTION OF THE DRAWINGS

FIG. 9-1 is a cryo-TEM photograph of nanoparticles according to one embodiment of the present invention. FIG. 9-2 is an enlarged photograph of FIG. 9-1. FIG. 9-3 is a graph of Fourier-transforming electron diffraction of nanoparticles according to one embodiment of the present invention.

DETAILED DESCRIPTION

Exemplary embodiments will hereinafter be described in the detailed description. However, these embodiments are exemplary, and this disclosure is not limited thereto.

A method of manufacturing nanoparticles of a target material according to one embodiment of the present invention includes mixing graphene oxide with an aqueous solvent to prepare an aqueous solution, mixing the target material with an organic solvent to prepare an organic solution, mixing the aqueous solution with the organic solution, and preparing nanoparticles of the target material by the graphene oxide.

The graphene oxide is a compound of which graphene is oxidized.

The graphene forms a polycyclic aromatic molecule by connecting a plurality of carbon atoms to each other via a covalent bond. The graphene is formed with a honeycomb-shaped carbon lattice, and the covalent-bonded carbon atoms may form a repeating unit of a hexagonal ring but may further include a pentagonal ring or a heptagonal ring. In addition, the graphene includes a monolayer of an $sp^2$ hybrid carbon sheet and has a thickness corresponding to around one atom. The graphene may form multilayers by stacking less than about 10 carbon sheets.

The graphene has merits of maintaining the characteristics even if bent and stretched, and high transparency. In addition, the graphene has high electrical conductivity and mechanical strength that are sufficient to apply to a flexible device.

Figure 1:
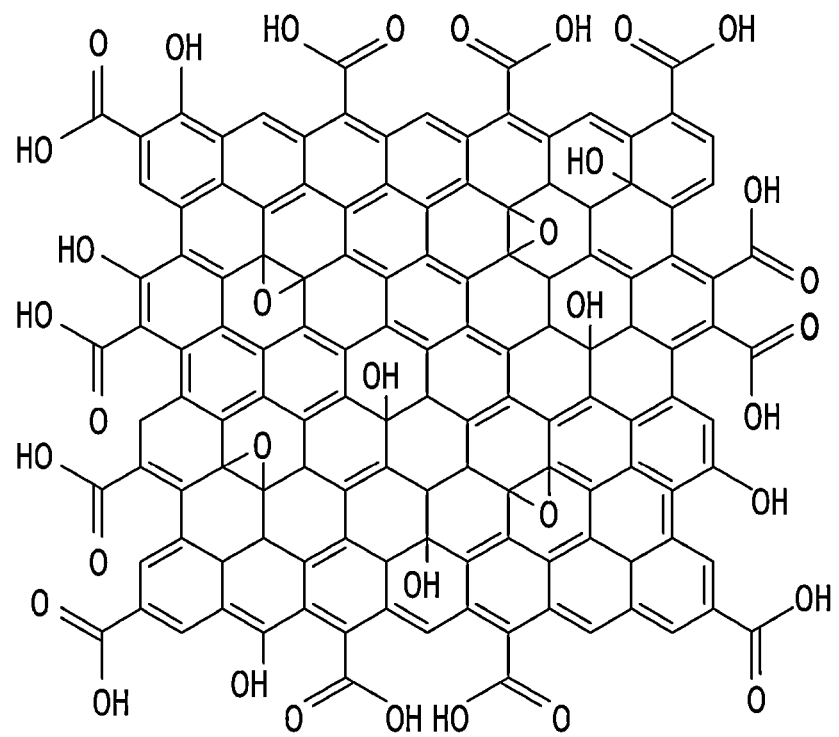
FIG. 1 is a structural formula showing a two-dimensional structure of graphene oxide.

The graphene oxide is a compound having an oxygen-included functional group such as an epoxy group, a hydroxy group, a carbonyl group, or a carboxyl group on the surface of the graphene. FIG. 1 shows a two-dimensional structure of graphene oxide.

The graphene oxide includes both hydrophilic group and hydrophobic group, so as to have amphipathy. In other words, the graphene oxide has hydrophilicity due to an alcohol group, a carboxyl group, or the like, and simultaneously has hydrophobicity due to the basal plane.

The graphene oxide may include any materials commonly used in this art, and the structure and physical properties thereof are not particularly limited. In this case, the graphene oxide may be available in the market or may be prepared by oxidizing graphite.

The aqueous solvent may be water, an alcohol-based solvent, N-methylpyrrolidone (NMP), dimethylformamide (DMF), or a combination thereof.

The target material indicates a general material used in the field pertaining to the present invention, and includes an organic material, an inorganic material, a metallic material, or a combination thereof.

The target material may be hydrophobic and may be dissolved in the organic solvent. The term "hydrophobic" means a property of being immiscible with water.

Specifically, the target material may include a polymer or a monomer.

Particularly, the polymer may be a light emitting polymer. In addition, the monomer may be a light emitting monomolecule.

The polymer is a generally-used polymer in the field pertaining to the present invention. Specifically, the polymer may be an acryl-based polymer, a styrene-based polymer, a vinyl-based polymer, a fluoro-based polymer, a rubber resin, an epoxy resin, nylon, cellulose, or a combination thereof.

More specifically, the polymer may include polymethylmethacrylate (PMMA), polystyrene (PS), poly-L-lactide (PLLA), polyϵ-caprolactone (PCL), polyethylene (PE), and the like.

The target material may specifically be a conjugated polymer. The term "conjugation" means interaction among 3 or more adjacent p-orbitals. The conjugated polymer is a polymer having a structure in which electrons are is delocalized in the p-orbital by alternately arranging a double bond and a single bond, in other words, by alternatively connecting a Π-bond and a σ-bond between carbons.

The conjugated polymer may be polyfluorene-based (PFO), polyphenylenevinylene-based (PPV), polythiophene-based (PT), polycarbazole-based, polyaniline-based, polypyrrole-based, and the like, but is not limited thereto.

Examples of the conjugated polymer may include poly(9, 9-dioctylfluorene-co-bithiophene) (F8T2), poly(3,3'''-didodecyl quaterthiophene) (PQT-12), poly(3-hexylthiophene) (P3HT), poly(9,9-dioctylfluorene-co-N-(4-methoxyphenyl) diphenylamine) (TFMO), poly(2,3-diphenyl-5-n-decyl-p-phenylenevinylene) (DP10-PPV), poly(2-methoxy-5-(3',7'-dimethoxyloctyloxy)-1,4-phenylenevinylene) (MDMO-PPV), poly(2,5-dioctyloxy p-phenylenevinylene) (DOO-PPV), poly(1-(p-n-butylphenyl)-2-phenylacetylene) (BuPA), ladder-type poly(para-phenylene) (m-LPPP), poly(2,5-dioctyl-1,4-phenylenevinylene) (POPPY), poly({9,9-dioctyl-2, 7-divinylene-fluorenylene}-alt-co-{2-methoxy-5-(2-ethylhexyloxy)-1,4-phenylene} (PFPV), poly(3-{2-(N-dodecylcarbamoyloxy)ethyl}thiophen-2,5-diyl) (P3DDUT), and the like, but are not limited thereto.

The conjugated polymer nanoparticles obtained by the method of manufacturing nanoparticles have a main characteristic of adsorbing and emitting light in the visible light range. By the characteristic, the conjugated polymer nanoparticles are adequately applied for an active layer of organic semiconductor device such as an organic solar cell or an organic light emitting diode (OLED); and when accomplishing a white organic light emitting diode (OLED), unexpected energy transfer does not occur between energy bandgaps of red, green, and blue materials, so the white light emitting diode having a high efficiency may be accomplished. In addition, differing from the conventional thin film, the thin film using nanoparticles may have a wide contact area, so it may be variously applied in a sensor.

The target material may be an organic semiconductor.

The organic semiconductor is an organic compound having semiconductor properties. Specific examples of the organic semiconductor may include a rubrene derivative, a pentacene derivative (e.g., triisopropylsilylethynyl pentacene (TIPS-PEN)), a thiophene derivative (e.g., sexythiophene), a phthalocyanine derivative (e.g., CuPc, copper phthalocyanine), a fullerene derivative, a perylene derivative (e.g., N,N'-ditridecylperylene-3,4,9,10-tetracarboxylic diimide (PTCDI-C13H27)), a carbon nanotube derivative, or a combination thereof. More specifically, PCBM ([6,6]phenyl-C61-butyric acid methyl ester), fullerene (C60), or the like may be mentioned, but is not limited thereto.

The target material may be a metal, an alloy, a metal oxide, or a mineral.

The metal refers to a metal commonly used in the field pertaining to the present invention. Specific examples thereof may include Li, Na, K, Rb, Cs, Fr, Be, Mg, Ca, Sr, Si, Sb, Pb, In, Zn, Ba, Ra, Ge, Al, Sn, or the like.

The alloy is obtained by mixing at least 2 kinds of the metals or adding a metal element such as carbon, boron, sulfur, hydrogen, or oxygen into the metal.

The metal oxide is a compound including the metallic element and oxygen. Specific examples thereof may include $Al_2O_3$, $SiO_2$, $TiO_2$, $SnO_2$, $CeO_2$, NiO, CaO, ZnO, MgO, $ZrO_2$, $Y_2O_3$, $SrTiO_3$, $BaTiO_3$, MgF, $Mg(OH)_2$, or the like.

The mineral is a homogeneous crystalline inorganic material, and may be an element mineral, a sulfide mineral, a halogen mineral, an oxide mineral, a hydroxide mineral, a nitrate, a carbonate salt, a borate salt, a sulfate salt, a chromate salt, a tungstate salt, a molybdate salt, a phosphate salt, an arsenate salt, a vanadate salt, a silicate salt, and the like. Particularly, the mineral may be one dissolved in the organic solvent.

The organic solvent refers to a solvent commonly used in the field pertaining to the present invention. Specifically, the organic solvent may be a hydrophobic organic solvent, a volatile organic solvent, or a non-polar organic solvent. More specifically, the organic solvent may include toluene, hexane, heptane, tetradecane, cyclohexane, chloroform, methyl chloride, carbon disulfide, acetone, acetonitrile, benzene, chlorobenzene, and the like.

The method of mixing the aqueous solution with the organic solution may include any methods generally used in the field pertaining to the present invention. For example, it may be mixed according to ultrasonication.

In the method of manufacturing nanoparticles, when the graphene oxide is not used, an aqueous solution and an organic solution are not mixed with each other, so that the phases may be separated. In this case, the target material dissolved in the organic solution is not dispersed in an aqueous solution. Accordingly, the target material dissolved in the organic solution does not form nanoparticles.

However, when the graphene oxide is used as in the method of manufacturing nanoparticles, the graphene oxide is amphipathic having both hydrophilicity and hydrophobicity, so as to play a role of an interface stabilizer of an aqueous solution and an organic solution. Thereby, when the aqueous solution is mixed with the organic solution, the graphene oxide may surround a target material to provide nanoparticles.

The graphene oxide may be present in a very thin layer having a thickness of about 0.1 to 1.0 nm, so the graphene oxide may surround a part or a whole of the target material surface when mixing the aqueous solution with the organic solution to provide a nano-sized particle.

The graphene oxide may be present in the interface between the target material dissolved in the organic solution, and an aqueous solution may act to decrease the interface energy. The target material dissolved in the organic solution may be present in an aqueous solution while being surrounded by graphene oxide.

The target material forming a particle in a state of being dissolved in the organic solvent is referred to as an organic solution particle hereinafter.

The nanoparticles may have a structure in which graphene oxide is formed on a surface of organic solution particles. In this case, the graphene oxide may be present in a layer.

Specifically, the nanoparticles may have a structure in which one graphene oxide layer surrounds one organic solution particle or a structure in which one graphene oxide layer surrounds about 2 to 10 organic solution particles. In this case, the graphene oxide layer may surround a part or a whole of organic solution particle surface. In addition, the 2 to 10 organic solution particles surrounded with one graphene oxide layer may be connected to each other.

The mixing solution may be in an emulsion form by mixing the aqueous solution with the organic solution.

According to another embodiment of the present invention, the method of manufacturing nanoparticles may further include removing the organic solvent after preparing the nanoparticles of the target material by graphene oxide.

The organic solvent may be removed according to any method generally known in the art. For example, when the organic solvent has a lower boiling point than that of an aqueous solution, the mixed solution is heated to the boiling point of the organic solvent to evaporate the organic solvent.

An aqueous solution in which nanoparticles are dispersed may be obtained by removing the organic solvent. In this case, the nanoparticles may have a structure in which a graphene oxide layer is formed on a surface of a target material particle. The nanoparticles have a core-shell structure in which the target material particle is a core, and the graphene oxide layer is formed as a shell on the surface thereof.

Specifically, the nanoparticles may have a structure in which one graphene oxide layer surrounds one target material particle or a structure in which one graphene oxide layer surrounds 2 to 10 target material particles. In this case, the graphene oxide layer may surround a part or a whole of the target material particle surface. In addition, the 2 to 10 target material particles surrounded with one graphene oxide layer may be connected to each other.

Figure 2:
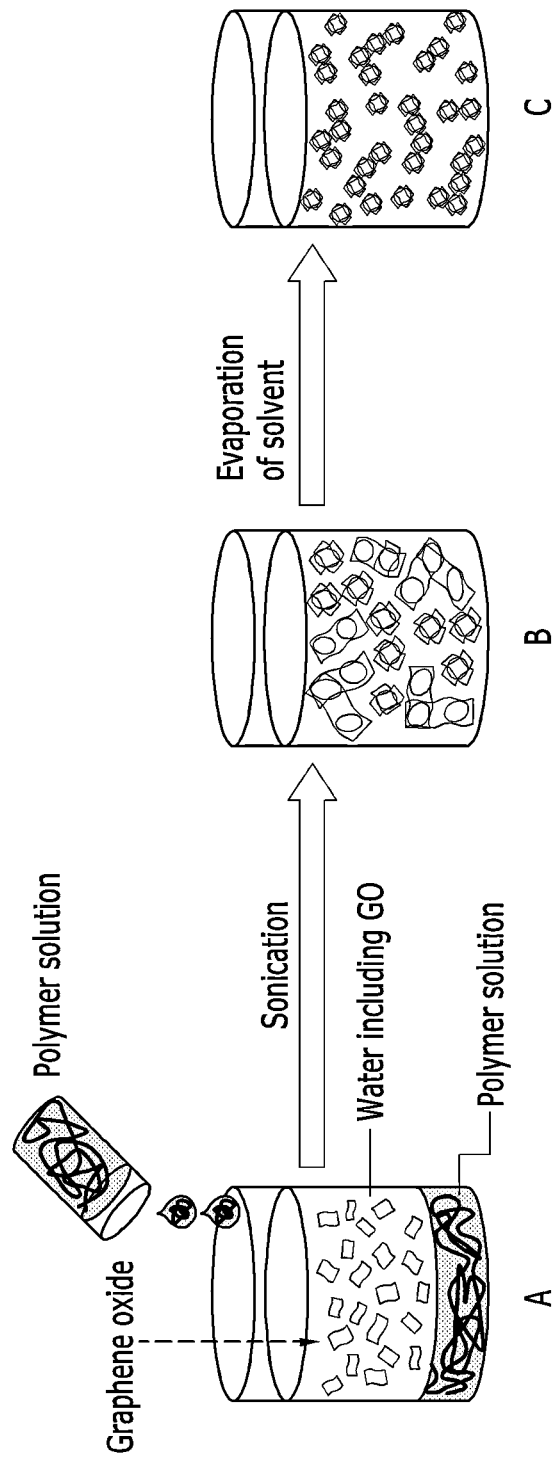
FIG. 2 is a view schematically showing a method of manufacturing nanoparticles according to one embodiment of the present invention.

FIG. 2 schematically shows a method of manufacturing nanoparticles. In FIG. 2, A indicates a mixed solution in which the organic solution dissolved with the target material is added into the aqueous solution mixed with the graphene oxide. In FIG. 2, B indicates nanoparticles of which the graphene oxide surrounds the organic solution particles. Herein, the organic solution particle is one in which the organic solution dissolved with the target material is present in a particle. In FIG. 2, C indicates nanoparticles having a shape in which the graphene oxide surrounds the target material particles after removing the organic solvent. The C may refer to an aqueous solution including nanoparticles.

The obtained nanoparticle aqueous solution may be applied to spin coating or various printing processes, so as to provide a wide-area uniform thin film and to save cost since it does not require vacuum deposition equipment. By using the aqueous solvent, the nanoparticle aqueous solution has merits of being environmentally friendly and that it may be applied to a field such as bioimaging since nanoparticles are dissolved in an aqueous solution.

In addition, when the graphene oxide is formed on the surface of the target material, a new functional group may be introduced to the nanoparticles by reacting the functional group such as the epoxy group, hydroxy group, carbonyl group, or carboxyl group present in the graphene oxide with other compounds. The nanoparticles having the various functions may be manufactured in according to such method.

On the other hand, the nanoparticles may have an average particle diameter of about 1 to 1000 nm. Specifically, it may be about 1 to 700 nm, about 1 to 500 nm, about 1 to 300 nm, about 1 to 200 nm, about 1 to 100 nm, or about 30 to 100 nm.

The graphene oxide may have a longitudinal diameter of about 1 to 1000 nm. Specifically, it may be about 1 to 700 nm, about 1 to 500 nm, about 1 to 300 nm, about 1 to 200 nm, about 1 to 100 nm, about 30 to 100 nm, about 300 to 1000 nm, about 500 to 1000 nm, about 300 to 500 nm, or about 500 to 700 nm. The longitudinal diameter of graphene oxide indicates a longer among the width and length in the two-dimensional structure of graphene oxide.

The smaller the longitudinal diameter of graphene oxide is, the easier it may be for the single graphene oxide to surround one nanoparticle. For example, when the graphene oxide has a longitudinal diameter of about 1 to 300 nm or about 1 to 100 nm, a single graphene oxide layer surrounds one nanoparticle to provide each independent nanoparticle.

When increasing the longitudinal diameter of graphene oxide, a single graphene oxide layer may surround more nanoparticles. In other words, several nanoparticles are bonded in a single graphene oxide layer. For example, when the graphene oxide has a longitudinal diameter of about 500 to 1000 nm or about 500 to 700 nm, a single graphene oxide layer may surround several nanoparticles, and the nanoparticles may be connected to each other.

The graphene oxide may be included in about 1 to 10 parts by weight based on 100 parts by weight of the aqueous solution. Specifically, the content of graphene oxide may be about 1 to 8, about 1 to 6, about 1 to 4, about 1 to 3, about 3 to 10, about 5 to 10, or about 3 to 6 parts by weight.

When increasing the content of graphene oxide within the content range, the single graphene oxide layer more easily surrounds one nanoparticle. In this case, a single graphene oxide layer surrounds one nanoparticle to provide each independent nanoparticle.

When decreasing the content of the graphene oxide within the content range, the single graphene oxide layer surrounds several nanoparticles. In this case, the single graphene oxide layer surrounds several nanoparticles, and then the nanoparticles are connected to each other by the graphene oxide.

The target material is included in about 0.1 to 10 parts by weight based on 100 parts by weight of the organic solution. Specifically, the content of the target material may be about 0.5 to 10, about 0.1 to 8, or about 0.5 to 8 parts by weight.

When the content of the target material is within the range, the nanoparticles may be obtained at a high yield.

On the other hand, when increasing the concentration of the target material within the range, the size of the nanoparticles is increased. In this way, the size of the nanoparticles may be adjusted by changing the concentration of the target material.

According to a further embodiment of the present invention, the method of manufacturing nanoparticles may further include reducing the graphene oxide after removing the organic solvent.

The graphene oxide may be reduced in accordance with any method commonly used in the field pertaining to the present invention. For example, the reduction may be performed by using a reducing agent such as hydrazine, by heating, by using light (microwave, ultraviolet (UV), etc.), and the like.

When further including reducing the graphene oxide, the nanoparticles may have a structure in which graphene is formed on the surface of the target material particles. The graphene may be present as a layer.

Specifically, the nanoparticles may have a structure in which one graphene layer surrounds one target material particle or a structure in which one graphene layer surrounds about 2 to 10 target material particles. In this case, the graphene layer may surround a part or a whole of the target material particle surface. In addition, the 2 to 10 target material particles surrounded with one graphene layer may be connected to each other.

According to one embodiment of the present invention, a nanoparticle including a target material and a graphene or a graphene oxide formed on a surface of the target material is provided.

The graphene and the graphene oxide are the same as described above. The specific examples of the target material are the same as described above.

The nanoparticles may have a structure in which graphene or a graphene oxide is formed on a surface of the target material particle. Specifically, the nanoparticles may have a structure in which one graphene or graphene oxide layer surrounds one target material particle. In addition, the structure may be one in which one graphene or graphene oxide layer surrounds about 2 to 10 target material particles. In this case, the graphene or graphene oxide layer may surround a part or a whole of the target material particle surface. In addition, the 2 to 10 target material particles surrounded with one graphene or one graphene oxide layer may be connected to each other.

The nanoparticles may have an average particle diameter of about 1 to 1000 nm. Specifically, it may be about 1 to 700 nm, about 1 to 500 nm, about 1 to 300 nm, about 1 to 200 nm, about 1 to 100 nm, or about 30 to 100 nm.

According to another embodiment of the present invention, an aqueous solution including the nanoparticles is provided.

The nanoparticles according to the present invention or the nanoparticles obtained by the manufacturing method according to the present invention may be applied to various display elements such as a field emission display (FED), a liquid crystal display (LCD), a light emitting diode (LED), and an organic light emitting diode (OLED). In addition, the nanoparticles may be applied to various battery cells such as a supercapacitor, a fuel cell, or a solar cell, and may be effectively applied to various nanodevices such as a field effect transistor (FET) and a memory device, an electrical device such as a hydrogen storage device, an optical fiber, and a sensor, and so on.

According to one embodiment of the present invention, an organic light emitting diode (OLED) including the nanoparticles is provided. The polymer having light emitting characteristics of red, green, and blue may be formed in a nanoparticle by the method of manufacturing nanoparticles, thus white light may be produced by mixing them so as to be applicable to an organic light emitting diode. Particularly, using the nanoparticles according to one embodiment of the present invention and quantum dots for an active layer of the organic light emitting diode, a hybrid white light source may be provided.

The organic light emitting diode is an active light emitting-type display element using the phenomenon that electrons are combined with holes in an organic layer by flowing a current into the thin film of a fluorescent or phosphorescent organic compound to emit light.

Figure 18:
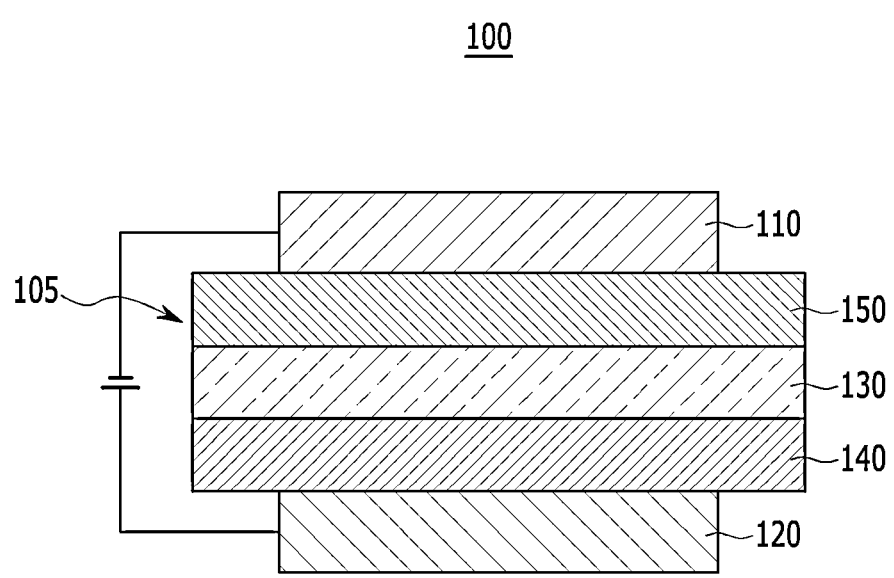
FIG. 18 is a cross-sectional view showing one embodiment of an organic light emitting diode according to one embodiment of the present invention.

FIG. 18 is a cross-sectional view of an organic light emitting diode according to one embodiment. Referring to FIG. 18, the organic light emitting diode has a structure including a positive electrode 120, a negative electrode 110, and at least one organic thin film layer 105 interposed between the positive electrode and the negative electrode.

The positive electrode (anode) 120 includes a positive active material, and the anode material may generally include a material having a high work function to easily inject holes into an organic thin film. Specific examples of the positive active material may include a metal such as nickel, platinum, vanadium, chromium, copper, zinc, gold, or an alloy thereof; a metal oxide such as zinc oxide, indium oxide, indium tin oxide (ITO), indium zinc oxide (IZO); a combination of a metal and an oxide such as ZnO and Al, or $SnO_2$ and Sb; a conductive polymer such as poly(3-methylthiophene), poly [3,4-(ethylene-1,2-dioxy)thiophene](polyethylene dioxythiophene: PEDT), polypyrrole, and polyaniline or the like, but is not limited thereto. Preferably, the positive electrode may be a transparent electrode including ITO (indium tin oxide).

The negative electrode (cathode) 110 includes a negative active material, and the negative active material may be a material having a low work function to easily inject electrons into an organic thin film layer. Specific examples of the negative active material may include a metal such as magnesium, calcium, sodium, potassium, titanium, indium, yttrium, lithium, gadolinium, aluminum silver, tin, lead, cesium, barium, or an alloy thereof; and a multi-layer structure material such as LiF/Al, $LiO_2$/Al, LiF/Ca, LiF/Al, and $BaF_2$/Ca or the like, but is not limited thereto. Preferably, the negative electrode may include an aluminum metal electrode.

Figure 5:
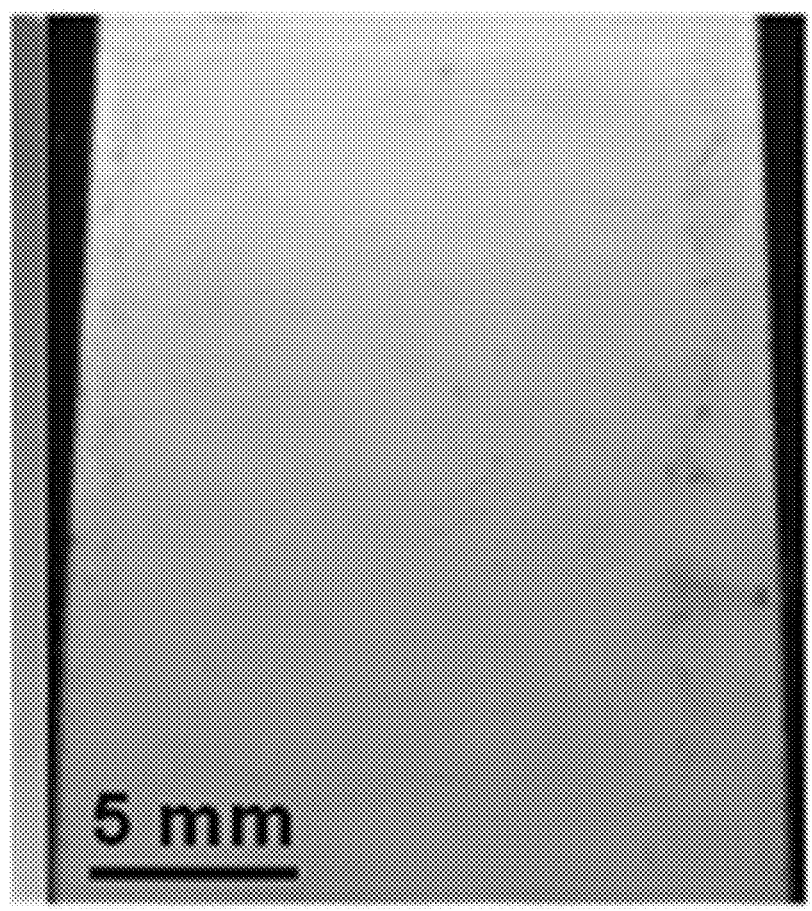
FIG. 5 is a photograph showing a thin film surface on which a nanoparticle aqueous solution according to one embodiment of the present invention is coated on the organic substrate.

Referring to FIG. 5, the organic thin film 105 may include five layers having different functions from each other, such as an electron injection layer (EIL) 160, an electron transport layer (ETL) 150, an emission layer 130, a hole transport layer (HTL) 140, and a hole injection layer (HIL) 170.

The emissive layer (EML) 130 is a layer forming excitons by combining the injected holes and electrons, and produces the light emitting phenomenon in which energy is emitted as light by returning the excitons to a ground state.

The hole injection layer (HIL) 170 is the nearest layer to the positive electrode, which helps holes to enter the emission layer. The hole injection layer (HIL) may improve the conjugation property with ITO for a positive electrode.

The hole transport layer (HTL) 140 plays a role of transferring holes injected into the hole injection layer (HIL) to an emission layer. In addition, the hole transport layer (HTL) plays a role of improving the conjugation property with a transparent electrode such as ITO and a hole transporting property.

The electron injection layer (EIL) 160 is a layer for receiving electrons in a negative electrode. When additionally including an electron injection layer (EIL) as in FIG. 18, it is effective for lowering the voltage.

The electron transport layer (ETL) 150 plays a role of transferring electrons injected from the electron injection layer (EIL) to an emission layer.

Particularly, the nanoparticles according to one embodiment of the present invention may be applied for an emission layer (EML) of an organic light emitting diode. Specifically, the nanoparticles may be coated on the emission layer (EML) according to the various printing techniques such as a spin coating and inkjet coating to be applied for an organic light emitting diode.

In the case of using the nanoparticles according to one embodiment in the field of the organic light emitting diode, the organic light emitting diode does not need an additional carrier transportation layer due to the bandgap of graphene oxide (LUMO: 1.29 eV, HOMO: 4.89 eV), and the carrier transportation is easier to maximize the efficiency of a device.

The organic light emitting diode may be fabricated in accordance with the general manufacturing method.

According to another embodiment of the present invention, a solar cell including the nanoparticles is provided. Generally, the solar cell is a device that converts solar light energy into the electrical energy and has a conjugated form of a p-type semiconductor and an n-type semiconductor, and the basic structure is the same as in the diode.

The solar cell may be broadly classified into silicon-based, compound-based, and organic-based depending upon the material used. Also, the solar cell is classified into a bulk solar cell and a thin film solar cell depending upon a thickness of the semiconductor layer, and the thin film solar cell is a solar cell having a semiconductor layer thickness of less than or equal to several microns to several tens of microns.

Particularly, the nanoparticles according to one embodiment of the present invention may be used in a photoactive layer of a solar cell. The conventional photoactive layer may adsorb light only in the visible ray range. When the nanoparticles adsorbing light having a wide adsorption wavelength range of about 250 to 1500 nm according to the present invention are used in the photoactive layer, the region of adsorbing light is widened to enhance the efficiency of a solar cell.

According to another embodiment of the present invention, a printing ink including the nanoparticles is provided. The aqueous solution in which nanoparticles are dispersed has good solution characteristics for printing, so as to be applied as ink for printed electronics. The nanoparticle aqueous solution makes the various printing processes possible. The printing may include inkjet printing, spin coating, roll-to-roll printing, screen printing, or the like.

The printing ink may be prepared by binding the nanoparticles with the ink base. The ink base may include an organic compound such as an aromatic compound, an aliphatic compound, and the like.

According to another embodiment of the present invention, a bioimaging device including the nanoparticles is provided. The nanoparticles according to one embodiment of the present invention have excellent particle uniformity and chemical stability, and may be prepared in an aqueous solution and easily dispersed in an aqueous solution, thus they are suitable for applying a material of a bioimaging device. Particularly, the graphene oxide is known for having biocompatibility, so as to provide merits of applying to a living body.

As a specific example of applying the nanoparticles for a bioimaging device, nanoparticles that emit light by adsorbing light of a certain wavelength range are adsorbed to a predetermined portion of a body, and the light emitting characteristics are monitored to observe changes of the body portion.

According to another embodiment of the present invention, a sensor including the nanoparticles is provided. The graphene oxide and the graphene have characteristics of easily adsorbing gas such as nitrogen oxide and ammonia, so as to be applied for a sensor. Particularly, by having the shape of nanoparticles, the specific surface area is increased to improve the sensitivity of a sensor.

Hereinafter, examples of the present invention and comparative examples are described. However, these embodiments are exemplary, and this disclosure is not limited thereto.

Example 1

0.6 mg of graphene oxide having an average longitudinal diameter of 100 nm obtained according to the Hummer method was added into water to provide a 10 mL aqueous solution. 10 mg of poly(9,9-dioctylfluorene) (PFO) was dissolved in 1 mL of chloroform to provide 1 mL of a 1 wt % organic solution. The organic solution was added into the aqueous solution and pulverized by a 30 W ultrasonicator (Sonics Vibra-Cell VCX 750) for 4 minutes to provide an emulsion. The obtained emulsion was heated at 60° C. for 6 hours to remove chloroform and to provide nanoparticles of which graphene oxide was formed on the surface of poly(9,9-dioctylfluorene).

Example 2

Nanoparticles were obtained in accordance with the same procedure as in Example 1, except that 5 mg of poly(2-methoxy-5-(2'-ethylhexyloxy)-1,4-phenylene vinylene) (MEH-PPV) was used as a 0.5 wt % organic solution instead of poly(9,9-dioctylfluorene).

Example 3

Nanoparticles were obtained in accordance with the same procedure as in Example 1, except for using graphene oxide having an average longitudinal diameter of 500 nm.

Example 4

Nanoparticles were obtained in accordance with the same procedure as in Example 1, except for adding 0.25 mg of graphene oxide.

Example 5

Nanoparticles were obtained in accordance with the same procedure as in Example 1, except for adding 0.4 mg of graphene oxide.

Example 6

Nanoparticles were obtained in accordance with the same procedure as in Example 1, except for using 50 mg of poly(9,9-dioctylfluorene) as a 5.0 wt % organic solution.

Comparative Example 1

10 mg of poly(9,9-dioctylfluorene) was dissolved in chloroform to provide a 1 mL organic solution. The organic solution was added to 10 ml of water and then pulverized by a 30 W ultrasonicator for 4 minutes.

Comparative Example 2

5 mg of poly(2-methoxy-5-(2'-ethylhexyloxy)-1,4-phenylenevinylene) was dissolved in chloroform to provide a 1 mL organic solution. The organic solution was added to 10 mL of water and then pulverized by a 30 W ultrasonicator for 4 minutes.

Experimental Example 1

Photograph of Nanoparticle Aqueous Solution

Figure 3:
FIG. 3 is a photograph showing a mixed solution of an organic solution dissolved with a target material and water including no graphene oxide.

FIG. 3 shows a photograph of a mixed solution obtained from Comparative Example 1. In FIG. 3, the transparent part indicates an aqueous solution, and the blue part indicates an organic solution. It is understood that in the case of using no graphene oxide in Comparative Example 1, the aqueous solution and the organic solution are separated by phase, and nanoparticles were not formed.

Figure 4:
FIG. 4 is a photograph of a nanoparticle aqueous solution according to one embodiment of the present invention.

FIG. 4 shows the nanoparticle aqueous solution obtained from Example 1. As shown in FIG. 4, it is confirmed that nanoparticles were uniformly dispersed in the aqueous solution. In addition, it is understood that when ultraviolet (UV) rays ($\lambda_{Ex}$=365 nm) were irradiated into the nanoparticles aqueous solution, the inherent photoluminescence of the poly(9,9-dioctylfluorene) polymer was expressed. It is confirmed that the nanoparticle aqueous solution was a stable solution which was not aggregated even after 3 months.

The nanoparticle aqueous solution obtained from Example 1 was coated on a glass substrate to provide a thin film, and FIG. 5 shows a photograph of the surface thereof. Thereby, it is confirmed that the nanoparticle aqueous solution showed uniform photoluminescence even in a wide area.

Experimental Example 2

Scanning Electron Microscope (SEM) and Transmission Electron Microscope (TEM) Photographs The nanoparticles obtained from Examples 1 to 6 were photographed using a SEM. In this case, an FE-SEM (HITACHI S-4100) was used. In addition, the nanoparticles obtained from Example 1 and Example 3 were photographed using a TEM. In this case, an FEI Tecnai F20 G2 TEM was used.

Figure 6:
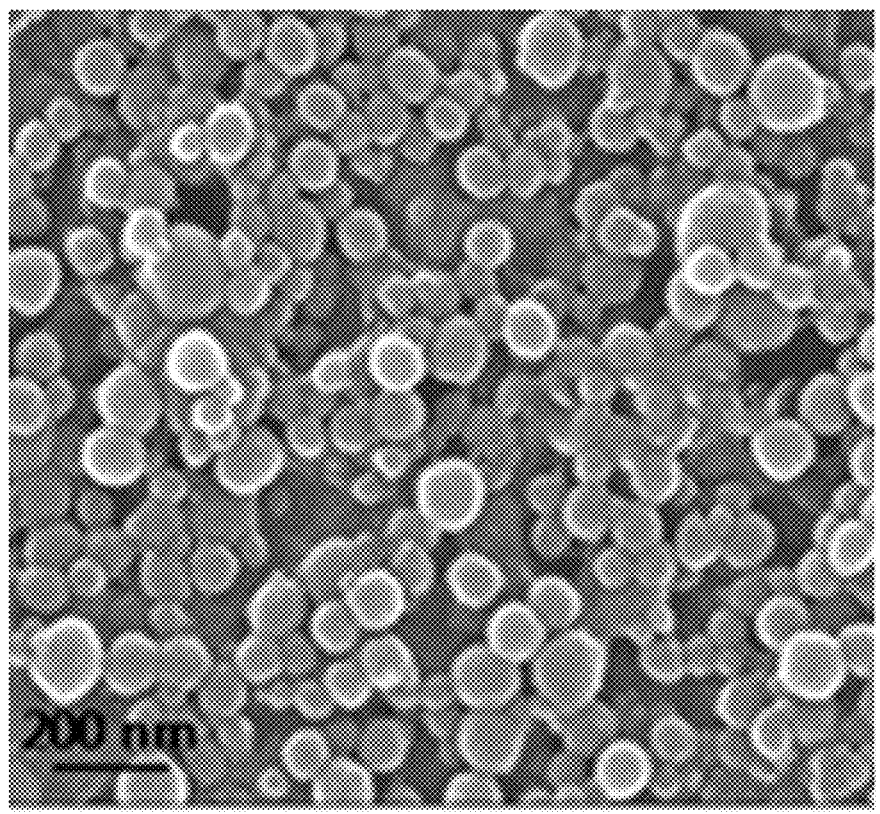
FIG. 6 is a scanning electron microscope (SEM) photograph of nanoparticles according to one embodiment of the present invention.
Figure 7:
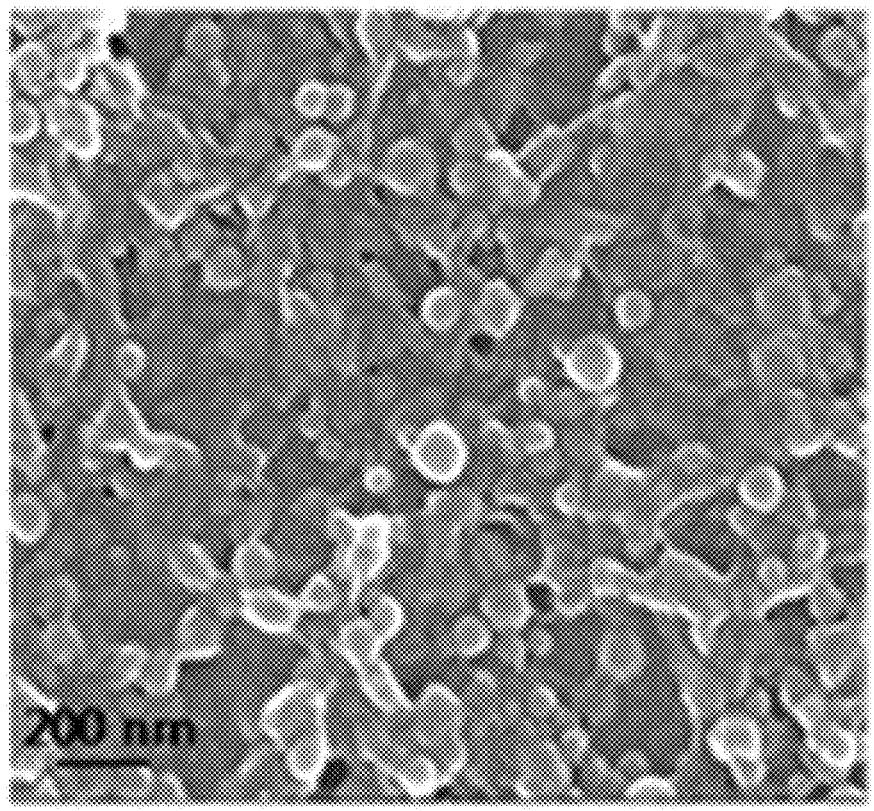
FIG. 7 is a SEM photograph of nanoparticles according to one embodiment of the present invention.

FIG. 6 is a SEM photograph of nanoparticles obtained from Example 1, and FIG. 7 is a SEM photograph of nanoparticles obtained from Example 2. As shown in FIG. 6 and FIG. 7, it is confirmed that uniform nanoparticles having a size of 30 to 100 nm were formed according to the method of manufacturing nanoparticles.

Figure 8:
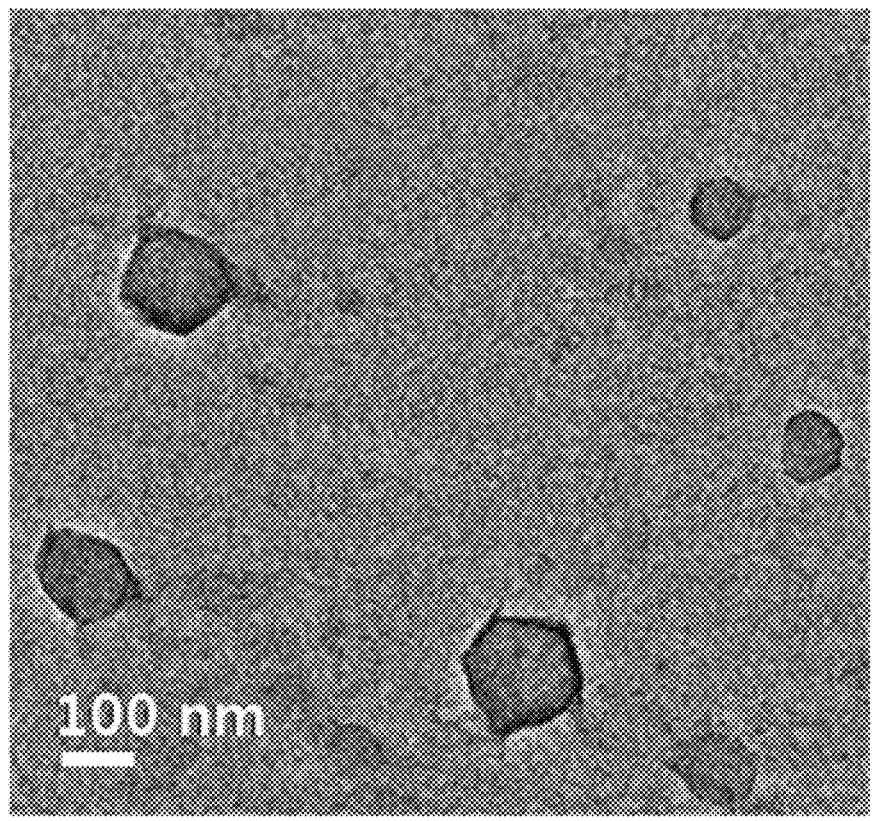
FIG. 8 is a transmission electron microscope (TEM) photograph of nanoparticles according to one embodiment of the present invention.

FIG. 8 is a TEM photograph of nanoparticles obtained from Example 1. In FIG. 8, the black border line indicates a graphene oxide. As shown in FIG. 8, it is understood that the nanoparticles obtained from Example 1 were present in a shape in which graphene oxide surrounds the surface of a target material.

Figures 1, 9:
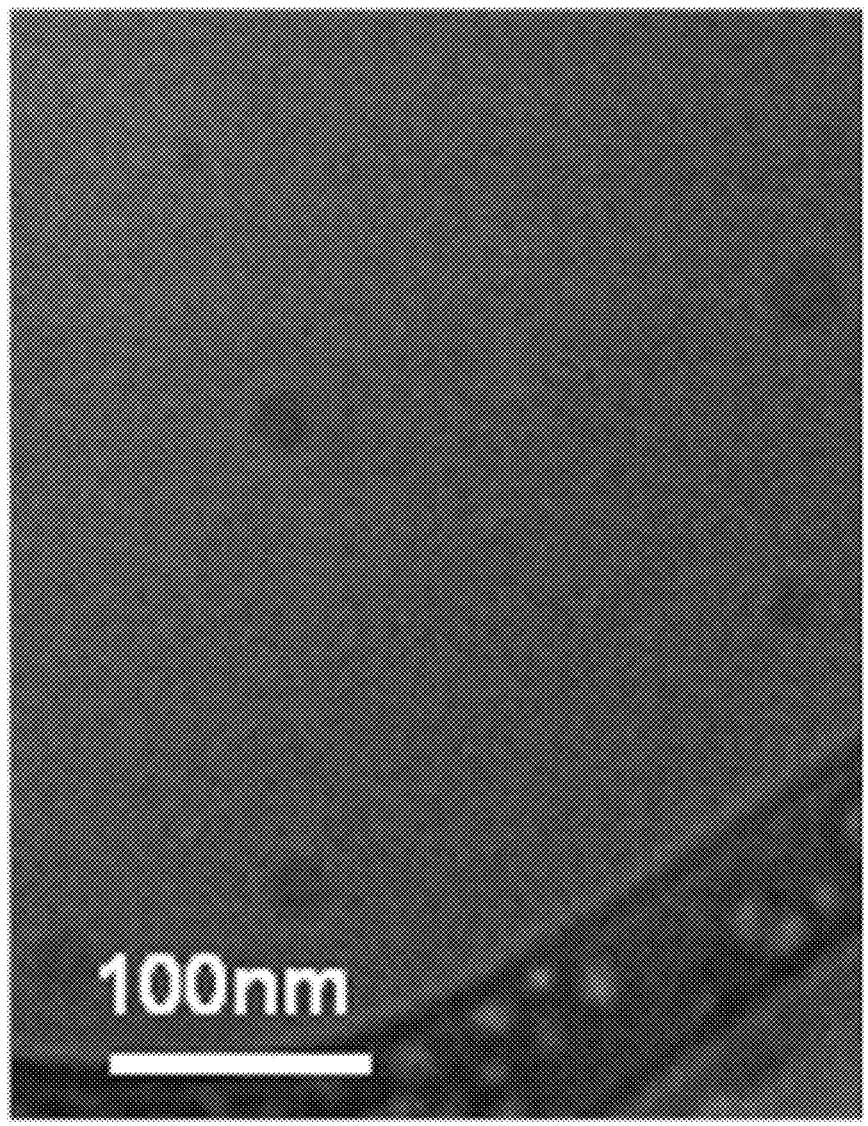
Figures 2, 9:
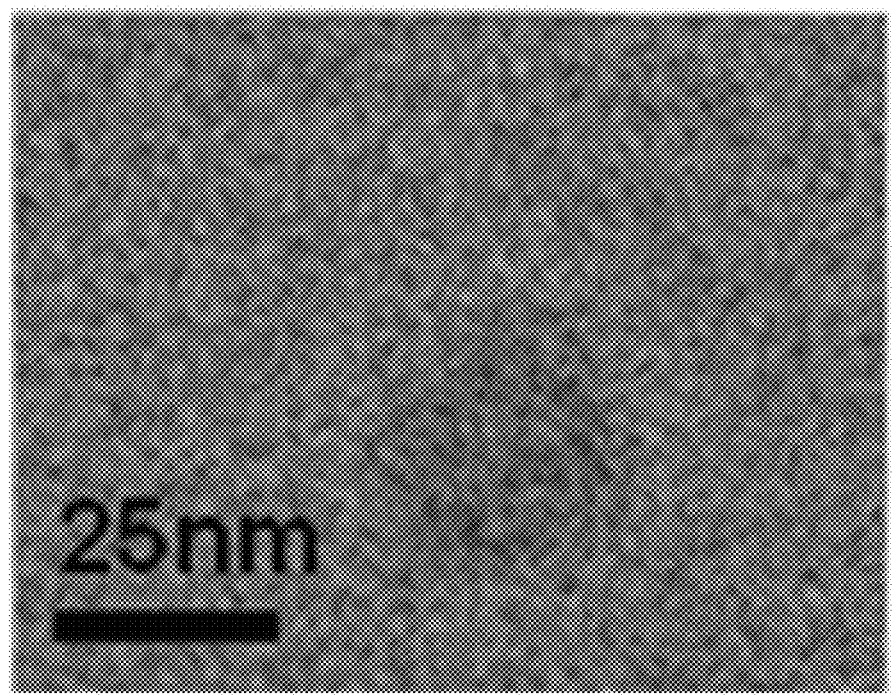
Figures 3, 9:
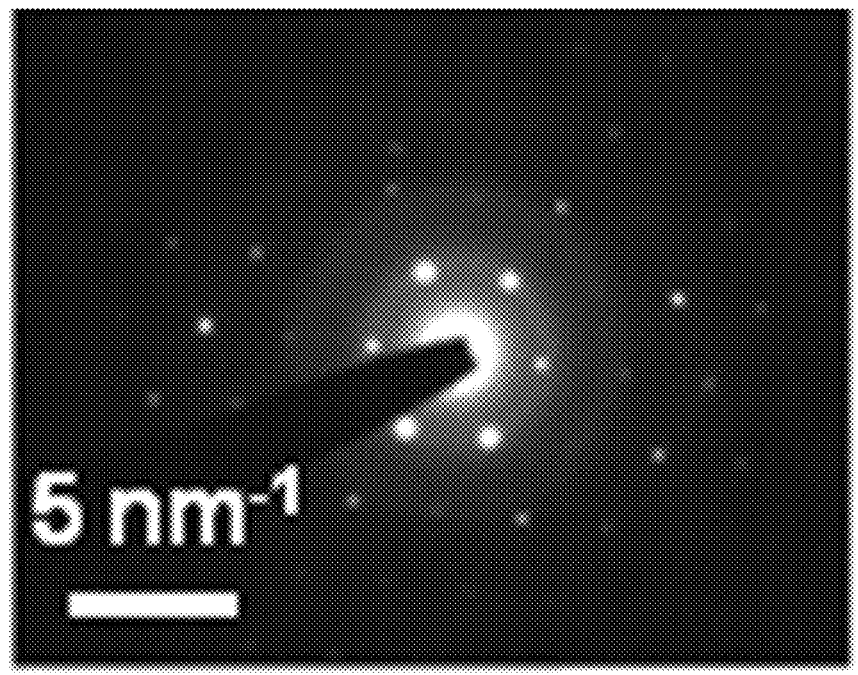

FIG. 9-1 is a cryo-transmission electron microscope (Cryo-TEM) photograph of nanoparticles obtained from Example 1, and FIG. 9-2 is a photograph enlarging the photograph of FIG. 9-1. As shown in FIG. 9-1 and FIG. 9-2, it is understood that the nanoparticles obtained from Example 1 were independently dispersed in an aqueous solution.

FIG. 9-3 is a graph of Fourier-transforming FIG. 9-1. From the electron diffraction pattern shown in FIG. 9-3, the inherent electron diffraction pattern of graphene oxide may be confirmed. Poly(9,9-dioctylfluorene), the target material used in Example 1, did not show the electron diffraction of FIG. 9-3. This means that the nanoparticles obtained from Example 1 included graphene oxide.

Figure 10:
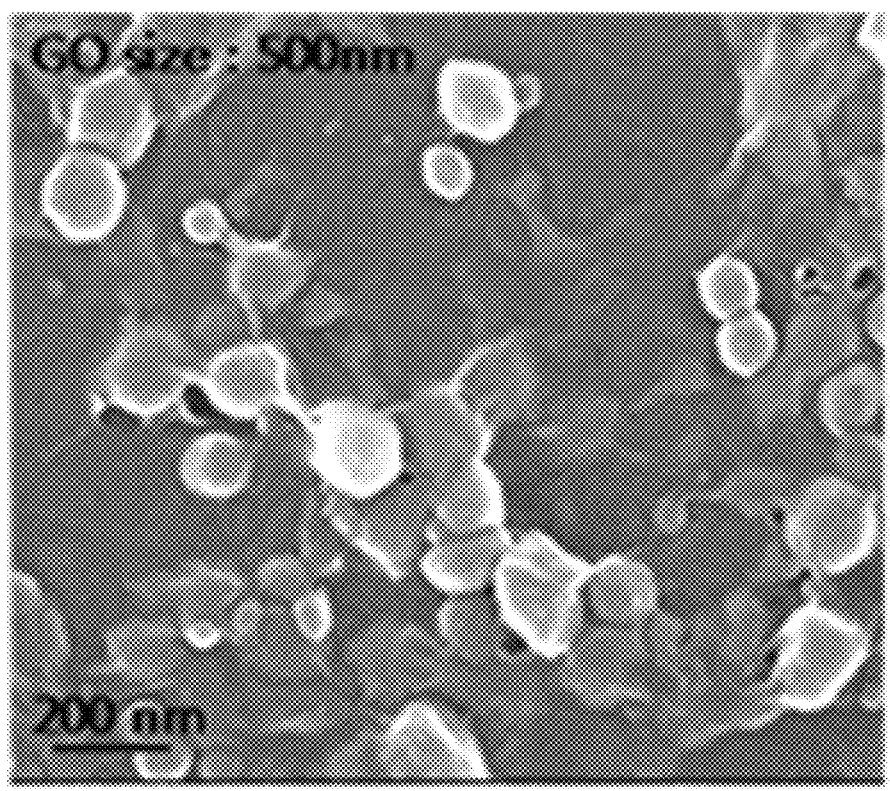
FIG. 10 is a SEM photograph of nanoparticles according to one embodiment of the present invention.
Figure 11:
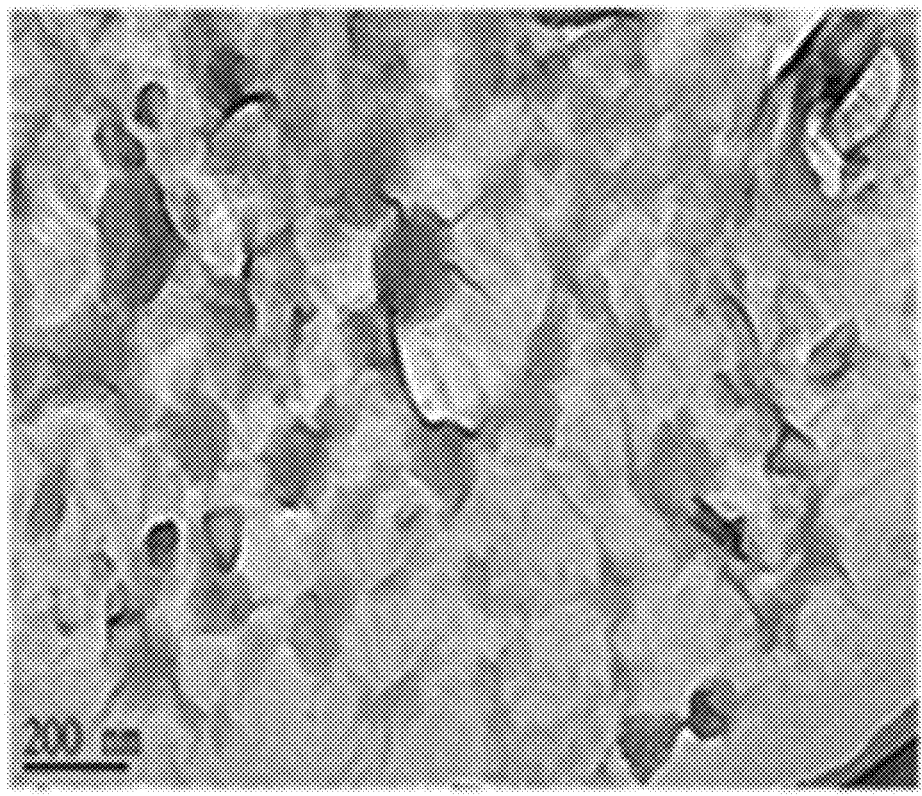
FIG. 11 is a TEM photograph of nanoparticles according to one embodiment of the present invention.

FIG. 10 is a SEM photograph of nanoparticles obtained from Example 3, and FIG. 11 is a TEM photograph of nanoparticles obtained from Example 3. In FIG. 11, the black folded portion indicates graphene oxide.

As shown in FIG. 10 and FIG. 11, it is confirmed that a single sheet of graphene oxide surrounded more nanoparticles while increasing the particle diameter of graphene oxide, and in this case, the nanoparticles may be connected to each other. On the contrary, as shown in FIG. 6 which is a SEM photograph of nanoparticles obtained from Example 1, it is confirmed that a single sheet of graphene oxide more easily surrounded one nanoparticle when decreasing a longitudinal diameter of graphene oxide to provide each independent nanoparticle.

Figure 12:
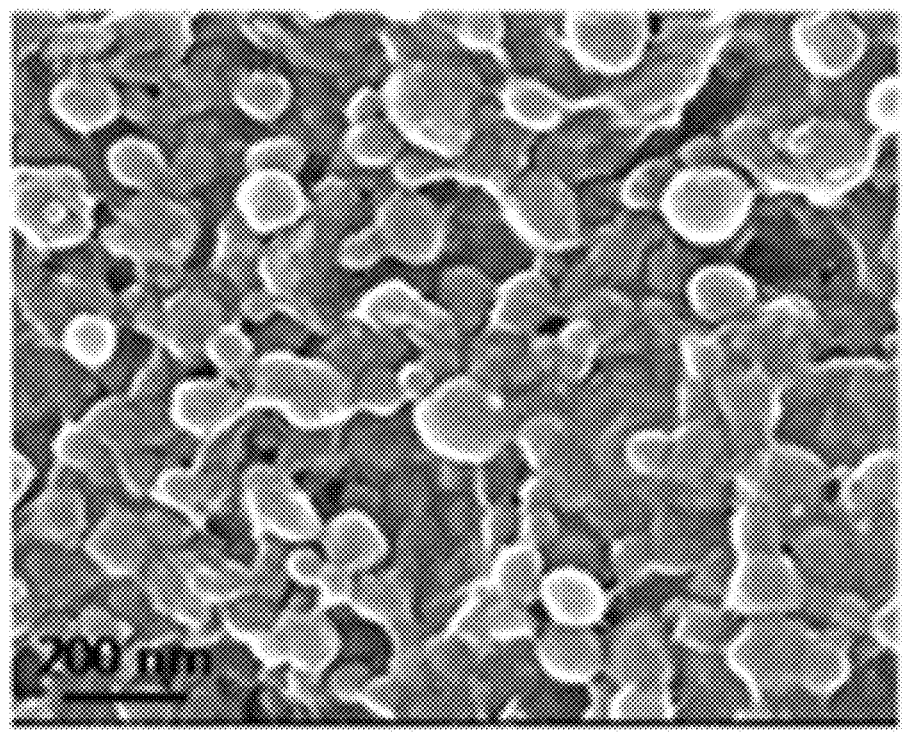
FIG. 12 is a SEM photograph of nanoparticles according to one embodiment of the present invention.
Figure 13:
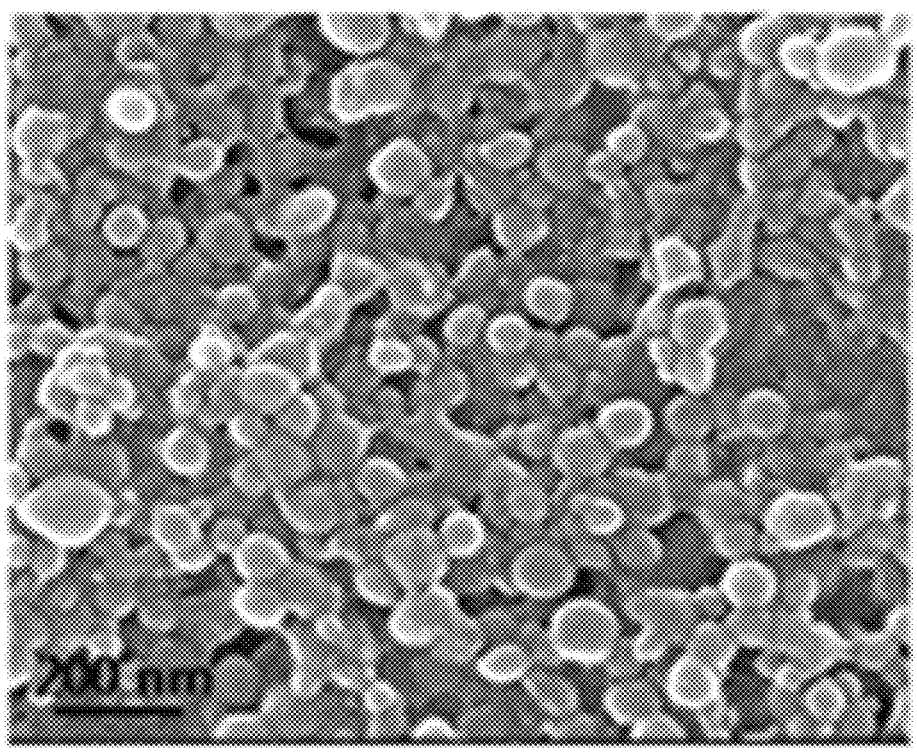
FIG. 13 is a SEM photograph of nanoparticles according to one embodiment of the present invention.

FIG. 12 is a SEM photograph of nanoparticles obtained from Example 4, and FIG. 13 is a SEM photograph of nanoparticles obtained from Example 5. As shown in FIG. 6, FIG. 12, and FIG. 13, it is understood that a single graphene oxide layer surrounded one nanoparticle to provide an independent nanoparticle in the case of FIG. 6 including a relatively high amount of graphene oxide, and single graphene oxide layer surrounded several nanoparticles which are connected to each other in the case of FIG. 12 including a relatively low amount of graphene oxide.

Figure 14:
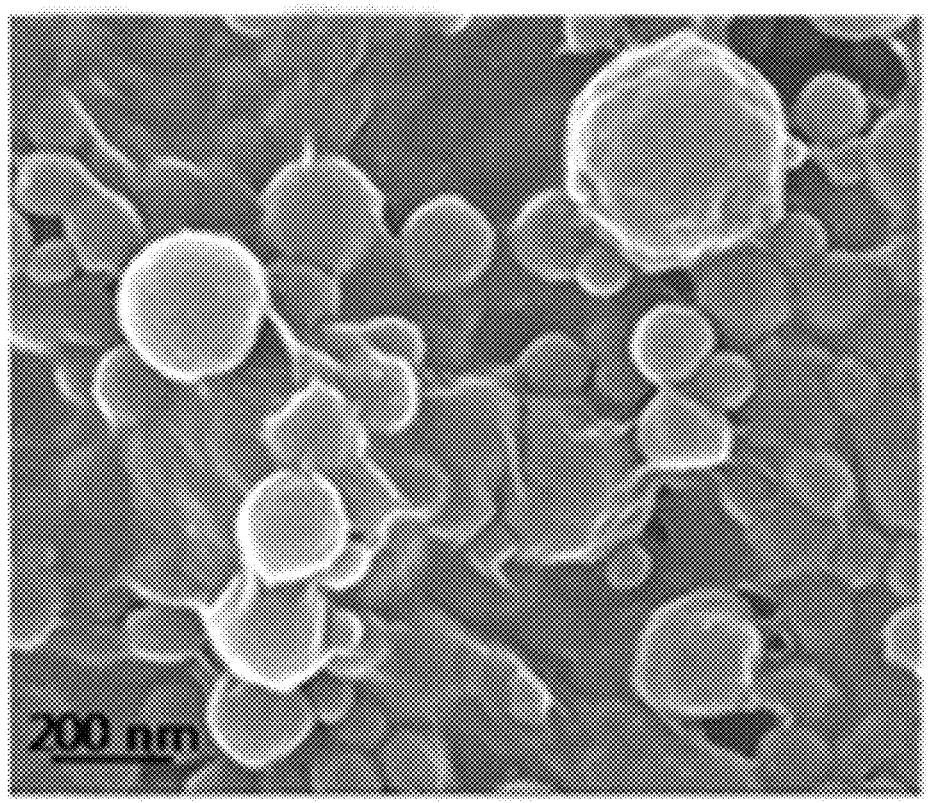
FIG. 14 is a SEM photograph of nanoparticles according to one embodiment of the present invention.

FIG. 14 is a SEM photograph of nanoparticles obtained from Example 6. It is understood that the nanoparticles of FIG. 14 were larger than the nanoparticles of FIG. 6 by about two times. In other words, it is confirmed that the size of the nanoparticles were increased when increasing the concentration of the target material.

Experimental Example 3

Ultraviolet (UV)-Visible Ray Absorption Spectrum (UV-Vis Spectrum) and Photoluminescence Spectrum (PL Spectrum)

Figure 15:
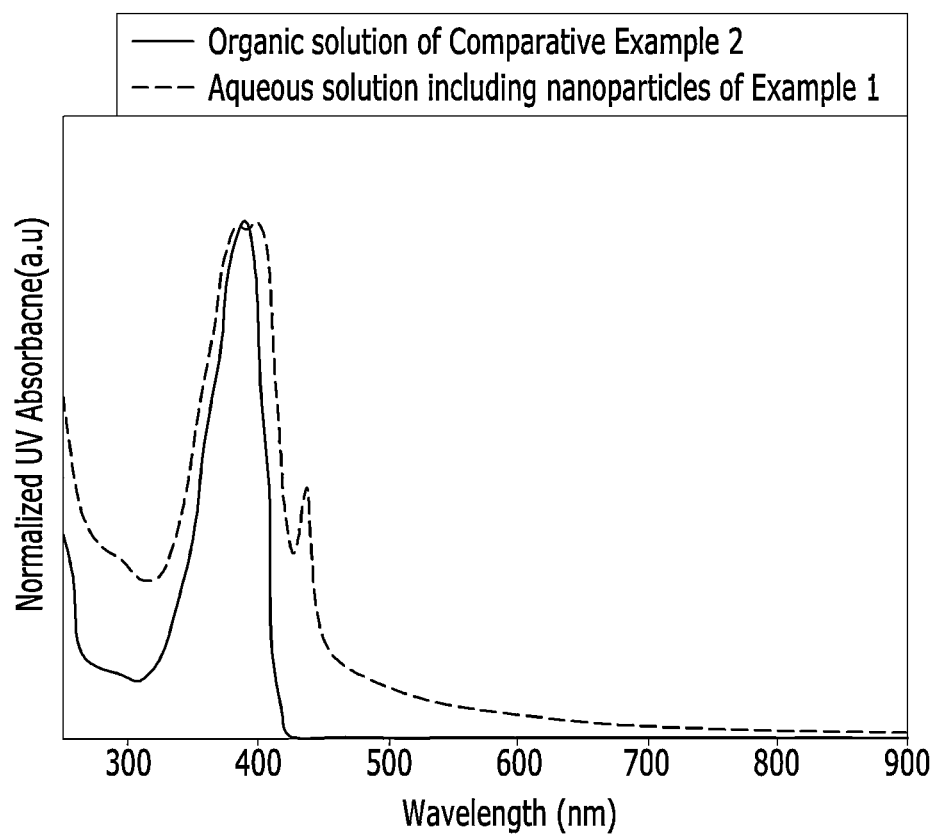
FIG. 15 shows an ultraviolet (UV)-visible ray absorption spectrum of an organic solution dissolved with a target material and a nanoparticle aqueous solution according to one embodiment of the present invention.
Figure 16:
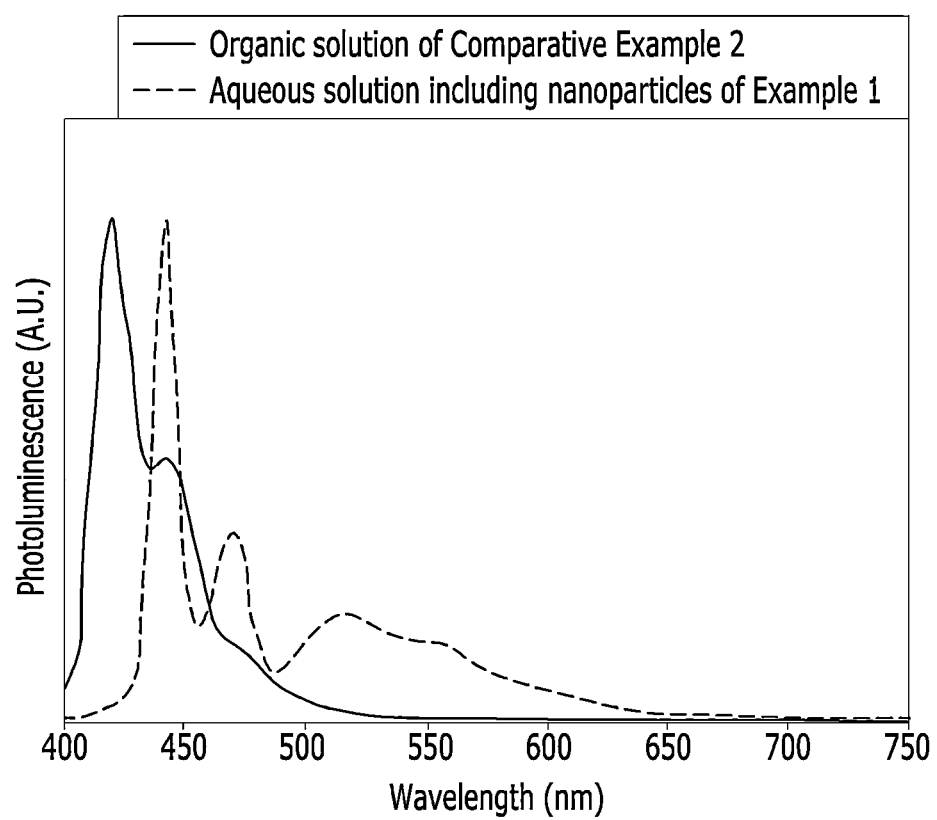
FIG. 16 shows a photoluminescence spectrum (PL spectrum) of an organic solution dissolved with a target material and a nanoparticle aqueous solution according to one embodiment of the present invention.

The organic solution obtained from Comparative Example 1 and the nanoparticle aqueous solution obtained from Example 1 were measured for ultraviolet (UV)-visible ray absorption spectrum using Agilent 8453 equipment. The results are shown in FIG. 15. In addition, a photoluminescence spectrum was measured using HITACHI F-7000 equipment, and the results are shown in FIG. 16. In FIG. 16, the light wavelength when exciting the organic solution obtained from Comparative Example 1 in the excited state was 390 nm, and the light wavelength when exciting the nanoparticle aqueous solution obtained from Example 1 in the excited state was 384 nm.

As shown in FIG. 15, it is confirmed that the nanoparticle aqueous solution spectrum according to Example 1 was shifted to the long wavelength compared to the organic solution spectrum according to Comparative Example 1, and peaks were produced at 410 nm and 440 nm.

In addition, as shown in FIG. 16, it is confirmed that the nanoparticle aqueous solution spectrum according to Example 1 was shifted to the long wavelength compared to the organic solution spectrum according to Comparative Example 1, and peaks were produced at 441 nm, 468 nm, 510 nm, and 550 nm.

The spectrum shows that the poly(9,9-dioctylfluorene) compound according to Example 1 was formed with nanoparticles to increase the conjugation length and had a beta-phase.

Poly(9,9-dioctylfluorene) may be classified into an alpha-phase and a beta-phase according to the chemical structure. The alpha-phase refers to a structure a polymer chain is twist-connected, and the beta-phase refers to a structure in which a repeating unit is intersected at 180° as in the following Chemical Formula A to flatly connect a polymer chain.

[Chemical Formula A]

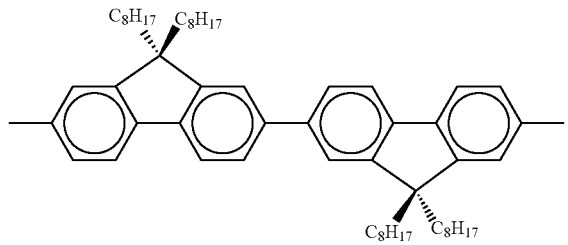

When the beta-phase part is developed in a conjugated polymer, the conjugation length is increased so as to provide high luminous efficiency. In addition, since excitons may be quickly transported to the beta-phase part having low energy, the light emitting characteristics may be enhanced. In addition, a merit of faster carrier mobility may be provided compared to the conventional polymer.

Figure 17:
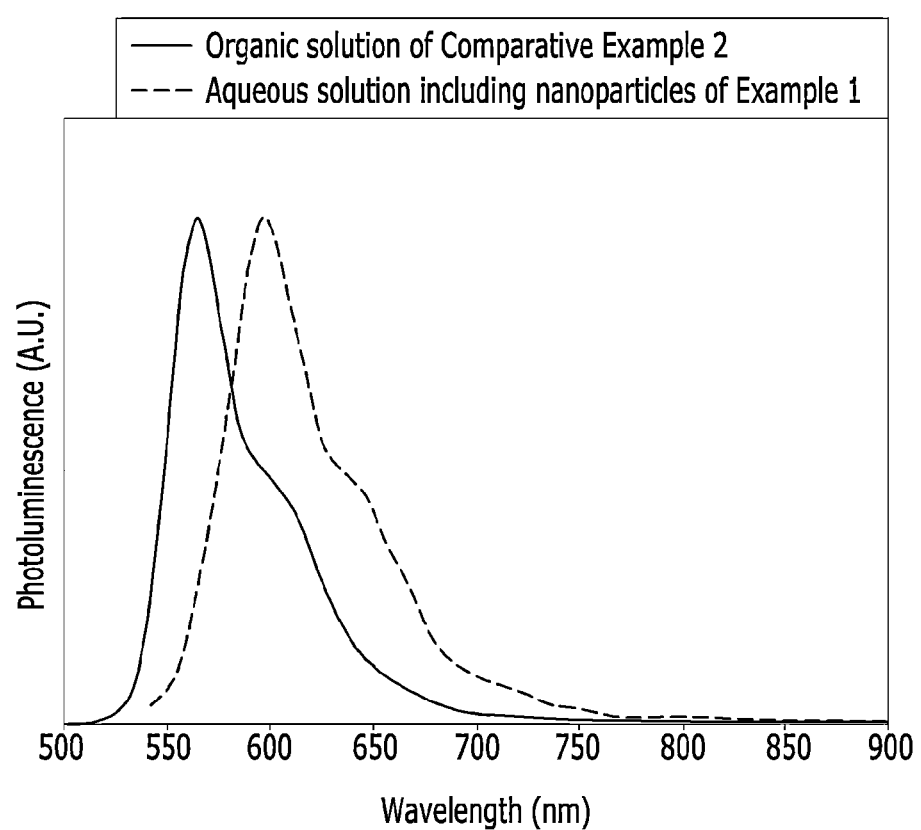
FIG. 17 shows a photoluminescence spectrum of an organic solution dissolved with a target material and a nanoparticle aqueous solution according to one embodiment of the present invention.

On the other hand, the organic solution obtained from Comparative Example 2 and the nanoparticle aqueous solution obtained from Example 2 were measured for photoluminescence spectrum, and the results are shown in FIG. 17. In FIG. 17, the light wavelength when exciting the organic solution obtained from Comparative Example 2 in the excited state was 498 nm, and the light wavelength when exciting the nanoparticle aqueous solution obtained from Example 2 in the excited state was 498 nm.

As shown in FIG. 17, it is confirmed that the nanoparticle aqueous solution spectrum according to Example 2 was shifted to the long wavelength side compared to the organic solution spectrum according to Comparative Example 2. This means that the MEH-PPV compound of Example 2 increased intrachain Π conjugation while providing nanoparticles.

| <Description of Symbols> | |
|---|---|
| 110: negative electrode | 120: positive electrode |
| 105: organic thin film | 130: emission layer |
| 140: hole transport layer (HTL) | 150: electron transport layer (ETL) |
| 160: electron injection layer (EIL) | 170: hole injection layer (HIL) |

What is claimed is:

1. Nanoparticles, comprising
   a target material, and
   graphene oxide formed on a surface of the target material,
   wherein the nanoparticles have a structure in which a graphene oxide layer surrounds one or more target material particles.

2. The method of claim 1, wherein the target material is an organic material, an inorganic material, a metallic material, or a combination thereof.

3. The method of claim 1, wherein the target material is a polymer, a monomolecule, an organic semiconductor, a metal, an alloy, a metal oxide, a mineral, or a combination thereof.

4. The method of claim 1, wherein the target material is a conjugated polymer.

5. The method of claim 1, wherein the method further comprises removing the organic solvent after preparing the nanoparticles of the target material by graphene oxide.

6. The method of claim 5, further comprising reducing the graphene oxide after removing the organic solvent.

7. The method of claim 1, wherein the nanoparticles have a structure in which one graphene oxide layer surrounds one target material particle.

8. The method of claim 1, wherein the nanoparticles have a structure in which one graphene oxide layer surrounds about 2 to 10 target material particles.

9. The method of claim 1, wherein the nanoparticles have an average particle diameter of about 1 to 1000 nm.

10. The method of claim 1, wherein the graphene oxide is included at about 1 to 10 parts by weight based on 100 parts by weight of the aqueous solution, and
    wherein the target material is included at about 0.1 to 10 parts by weight based on 100 parts by weight of the organic solution.

11. A method of manufacturing the nanoparticles of claim 1, comprising:
    mixing graphene oxide with an aqueous solvent to prepare an aqueous solution;
    mixing the target material with an organic solvent to prepare an organic solution;
    mixing the aqueous solution with the organic solution; and
    preparing nanoparticles of the target material by the graphene oxide.

12. The nanoparticles of claim 11, wherein the target material is an organic material, an inorganic material, a metallic material, or a combination thereof.

13. The nanoparticles of claim 11, wherein the target material comprises at least one selected from a polymer, a monomolecule, an organic semiconductor, a metal, an alloy, a metal oxide, a mineral, and a combination thereof.

14. The nanoparticles of claim 11, wherein the target material is a conjugated polymer.

15. The nanoparticles of claim 1, wherein the graphene oxide layer surrounds about 2 to 10 target material particles.

16. The nanoparticles of claim 1, wherein the nanoparticles have an average particle diameter of about 1 to 1000 nm.

17. An electronic device comprising the nanoparticles of claim 1.

18. The electronic device of claim 17, wherein the electronic device is an organic light emitting diode, a solar cell, a printing device, a bioimaging device, or a sensor.

* * * * *